(12) United States Patent
Reja et al.

(10) Patent No.: US 10,461,699 B1
(45) Date of Patent: Oct. 29, 2019

(54) SWITCH-MODE POWER AMPLIFIER FOR AN RF TRANSMITTER EMPLOYING DIGITALLY-CONTROLLED OOB HARMONIC ATTENUATION TECHNIQUES

(71) Applicant: Dialog Semiconductor B.V., 's-Hertogenbosch (NL)

(72) Inventors: Mahbub Reja, Chandler, AZ (US); Shobak Kythakyapuzha, Tempe, AZ (US)

(73) Assignee: Dialog Semiconductor B.V., 'S-Hertogenbosch (NL)

( * ) Notice: Subject to any disclaimer, the term of this patent is extended or adjusted under 35 U.S.C. 154(b) by 0 days.

(21) Appl. No.: 16/238,572

(22) Filed: Jan. 3, 2019

(51) Int. Cl.
| | |
|---|---|
| *H03F 1/04* | (2006.01) |
| *H03F 1/02* | (2006.01) |
| *H03F 3/24* | (2006.01) |
| *H03F 3/193* | (2006.01) |
| *H03F 1/56* | (2006.01) |
| *H04B 1/04* | (2006.01) |

(52) U.S. Cl.
CPC ........... *H03F 1/0205* (2013.01); *H03F 1/565* (2013.01); *H03F 3/193* (2013.01); *H03F 3/245* (2013.01); *H04B 1/04* (2013.01); *H03F 2200/171* (2013.01); *H03F 2200/387* (2013.01); *H03F 2200/451* (2013.01); *H04B 2001/0408* (2013.01)

(58) Field of Classification Search
CPC .. H03F 3/217; H03F 3/2176; H03F 2200/351; H03F 2200/507; H03F 2203/7236; H03F 3/195; H03F 2200/451; H03F 3/2178; H04B 1/0475; H03K 2217/009; H03K 2217/0063; H03K 2217/0072; Y02P 80/112
See application file for complete search history.

(56) References Cited

U.S. PATENT DOCUMENTS

2015/0084691 A1\* 3/2015 Hori ..................... H03K 17/687
330/251

\* cited by examiner

*Primary Examiner* — Rahel Guarino
(74) *Attorney, Agent, or Firm* — Saile Ackerman LLC; Stephen B. Ackerman

(57) ABSTRACT

The present document describes a digital power amplifier configured to provide an amplified output signal at an output port based on an input signal. The power amplifier comprises a drive unit configured to generate a high side drive signal comprising a sequence of pulses for controlling the high side switch and a low side drive signal comprising a sequence of pulses for controlling the low side switch, respectively. The drive signals are generated such that the pulses of the high side drive signal are non-overlapping with regards to the pulses of the low side drive signal, and such that the sequence of pulses of the high side drive signal and the sequence of pulses of the low side drive signal have a reduced fraction of energy from higher order harmonics compared to a sequence of rectangular shaped pulses.

19 Claims, 5 Drawing Sheets

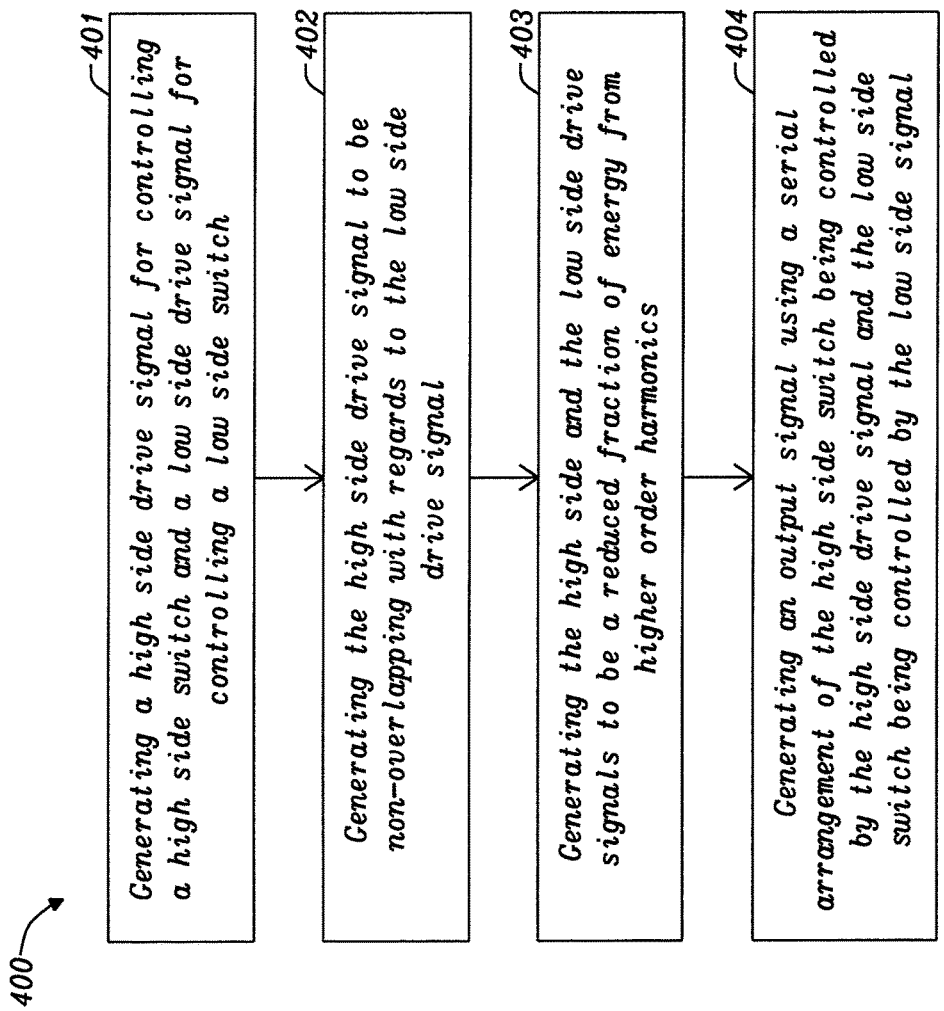

SWITCH-MODE POWER AMPLIFIER FOR AN RF TRANSMITTER EMPLOYING DIGITALLY-CONTROLLED OOB HARMONIC ATTENUATION TECHNIQUES

TECHNICAL FIELD

The present document relates to a switch-mode power amplifier for use within an RF (radio frequency) transmitter.

BACKGROUND

Switch-mode RF power amplifiers (notably Class-D or Class E amplifiers) may be used in RF transmitters (notably in CMOS (complementary metal oxide semiconductor) transmitters) for short-range wireless communications (such as Bluetooth or Zigbee). As an example, an all-digital CMOS class D powers amplifier (comprising logic gates, inverters, NANDs and/or NORS) may be used for a Bluetooth low-energy (BLE) radio transceiver. The theoretical efficiency of such a power amplifier is 100%, because the square waveform which is processed by the power amplifier causes non-overlapping of voltage and current signals that delivers 100% in-band energy.

However, in practice, along with the efficient power transmission within the allocated in-band bandwidth (e.g. $f_0$=2.400 GHz-2.484 GHz), unwanted spurious emissions in the out-of-band (OOB) domain typically needs to be controlled and/or attenuated to comply with regulatory emission limits. By way of example, the FCC (Federal Communications Commission) regulations restrict the BLE out-of-band harmonic ($2^{nd}$, $3^{rd}$, $4^{th}$ and other higher order harmonics) power level to be below a certain level (e.g. <−45 dBm), in order to avoid interferences with the operating frequencies of other cellular, territorial and/or wireless personal-area-networks.

However, switch-mode class D power amplifiers (PAs), which are operated with non-sinusoidal RF signals (e.g. rectangular or square signals), typically generate a relatively high level of OOB harmonics (e.g. at $2f_0$, $3f_0$, $4f_0$, $5f_0$) along with the wanted signal (being the fundamental $f_0$). Theoretically, for ideal rectangular RF signals (with sharp rise and fall times) having a 50% duty cycle (i.e. having an even symmetry), only odd harmonics ($3f_0$, $5f_0$) are generated. In practice, for non-ideal RF signals (with relatively long rise and fall times and with imperfections due to device and inter-connect parasitics) the duty cycles deviate from 50% and the even symmetry does not hold. This causes the generation of both odd and even harmonics.

SUMMARY

The present document addresses the technical problem of providing a power efficient digital power amplifier, notably a Class-D power amplifier, for an RF transmitter, the power amplifier having reduced higher harmonic energy. In other words, the present document addresses the technical problem of providing a power efficient digital RF transmitter with an effective active-circuit harmonic attenuation and control scheme.

According to an aspect, a digital power amplifier is described which is configured to provide an amplified output signal at an output port based on an input signal. The power amplifier comprises an output stage comprising a serial arrangement of a high side switch and a low side switch, wherein the output port is coupled to a midpoint between the high side switch and the low side switch. Furthermore, the power amplifier comprises a drive unit configured to generate a high side drive signal comprising a sequence of pulses for controlling the high side switch and a low side drive signal comprising a sequence of pulses for controlling the low side switch, respectively, based on the input signal. The drive signals may be generated such that the pulses of the high side drive signal are non-overlapping with regards to the pulses of the low side drive signal. Furthermore, the drive signals may be generated such that the sequence of pulses of the high side drive signal and the sequence of pulses of the low side drive signal have a reduced fraction of energy from higher order harmonics compared to a sequence of rectangular shaped pulses.

According to a further aspect, a method for providing an amplified output signal at an output port based on an input signal is described. The method comprises generating a high side drive signal comprising a sequence of pulses for controlling a high side switch and a low side drive signal comprising a sequence of pulses for controlling a low side switch, respectively, based on the input signal. The drive signals may be generated such that the pulses of the high side drive signal are non-overlapping with regards to the pulses of the low side drive signal. Furthermore, the drive signals may be generated such that the sequence of pulses of the high side drive signal and the sequence of pulses of the low side drive signal have a reduced fraction of energy from higher order harmonics compared to a corresponding sequence of rectangular shaped pulses. Furthermore, the method comprises generating the output signal using a serial arrangement of the high side switch being controlled by the high side drive signal and the low side switch being controlled by the low side drive signal.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings.

FIG. 4 shows a flow chart of an example method for generating an amplified output signal.

DETAILED DESCRIPTION

As outlined above, the present document is directed at providing a power efficient digital power amplifier for an RF digital transmitter with reduced higher-order harmonic energy (for frequencies $2f_0$, $3f_0$, $4f_0$, $5f_0$, etc.).

In an RF digital transmitter, a duty-cycle correction circuit may be used for maintaining a 50% duty cycle, in order to maintain even symmetry (thereby avoiding even-order harmonics). However, a high-frequency duty-cycle correction circuit may cause RF signal loss and may lead to increased power consumption and reduced PA efficiency. Alternatively, or in addition, a lossy RC technique may be used, where the capacitance of a transmitter may be tuned to adjust the duty cycle to 50% (by adjusting the rise and fall times).

Odd harmonics attenuation may typically not be achieved in an effective manner. For example, the use of an on-chip inductor for creating passive LC resonators typically results in relatively high space requirements. When using an off-chip solution, the use of an external LC filter typically results in additional insertion loss. These harmonics attenuation techniques may be used to attenuate odd and/or even harmonic frequencies ($2f_0$, $3f_0$, $4f_0$, $5f_0$), in order to attenuate OOB (or unwanted) RF signals to a desired level prior to transmission of an RF signal. These LC resonators may be tuned for a fixed level of harmonic attenuation, but the limited quality factor (Q factor) of an on-chip inductor typically limits the reduction of harmonic attenuation. Moreover, there is typically no control over the attenuation level and the frequency for different operating conditions (e.g. process, supply and temperature variations). Furthermore, both on-chip and off-chip passive harmonic attenuation techniques are relatively costly.

Figure 1A:
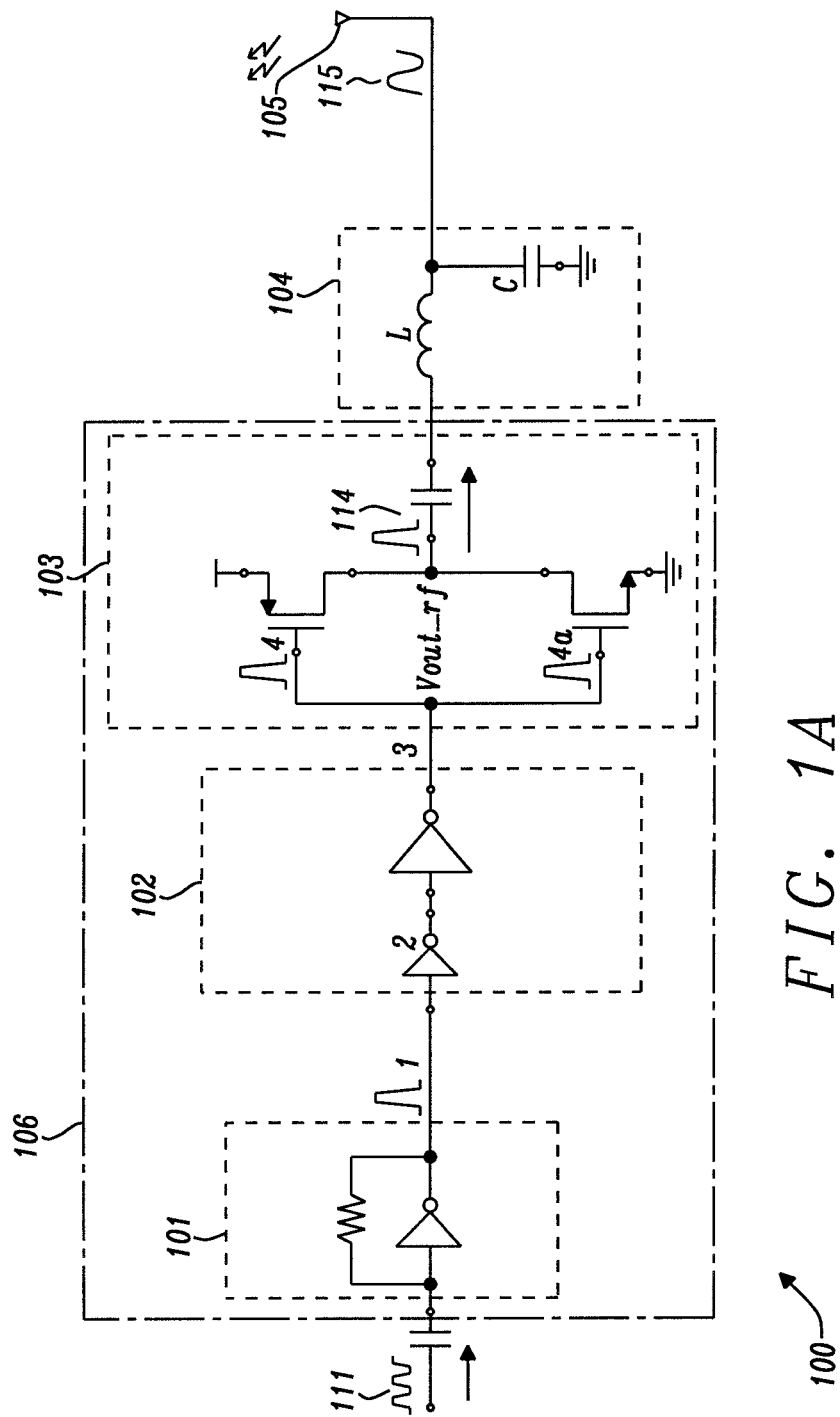
FIG. 1A shows an example digital RF transmitter.

FIG. 1A shows an example voltage-mode class-D (VMCD) power amplifier (PA) 106 within an all-digital RF transmitter 100. The output signal 114 ($V_{out\_rf}$) of the power amplifier 106 is a rectangular pulse (prior to the matching network 104). Theoretically, an ideal rectangular signal with a 50% duty cycle (even symmetry) contains only odd harmonics ($3f_0$, $5f_0$, etc.) but no even harmonics ($2f_0$, $4f_0$). Device parasitic and systematic imperfections typically lead to a non-ideal and/or non-50% duty-cycle rectangular signal as an output signal 114, thereby causing the presence of even harmonics ($2f_0$, $4f_0$). Due to a limited quality factor (Q factor) of on-chip inductors, the output LC matching network 104 is typically not able to filter out the undesired odd and even harmonics ($2f_0$, $3f_0$, $4f_0$, etc.) which are transmitted along with the desired fundamental signal at $f_0$, thereby causing a transmission signal 115 (also referred to herein as the filtered output signal) which is fed to the antenna 105 of the RF transmitter 100, wherein the transmission signal 115 comprises out-of-band harmonic content.

The RF transmitter 100 receives an input signal 111 which is typically a digital representation of an analog signal. In particular, the input signal 111 may comprise a sequence or train of square pulses. The analog signal, which is represented by the input signal 111, may be a modulated carrier signal at the fundamental frequency $f_0$. The input signal 111 may be processed by a pre-amplifier 101 and/or by a pre-driver 102. Furthermore, the power amplifier 106 comprises an output stage 103 for generating the output signal 114. The output signal 114 is generated by turning on and off a high side switch and a low side switch in an alternating (and mutually exclusive) manner.

Figure 1B:
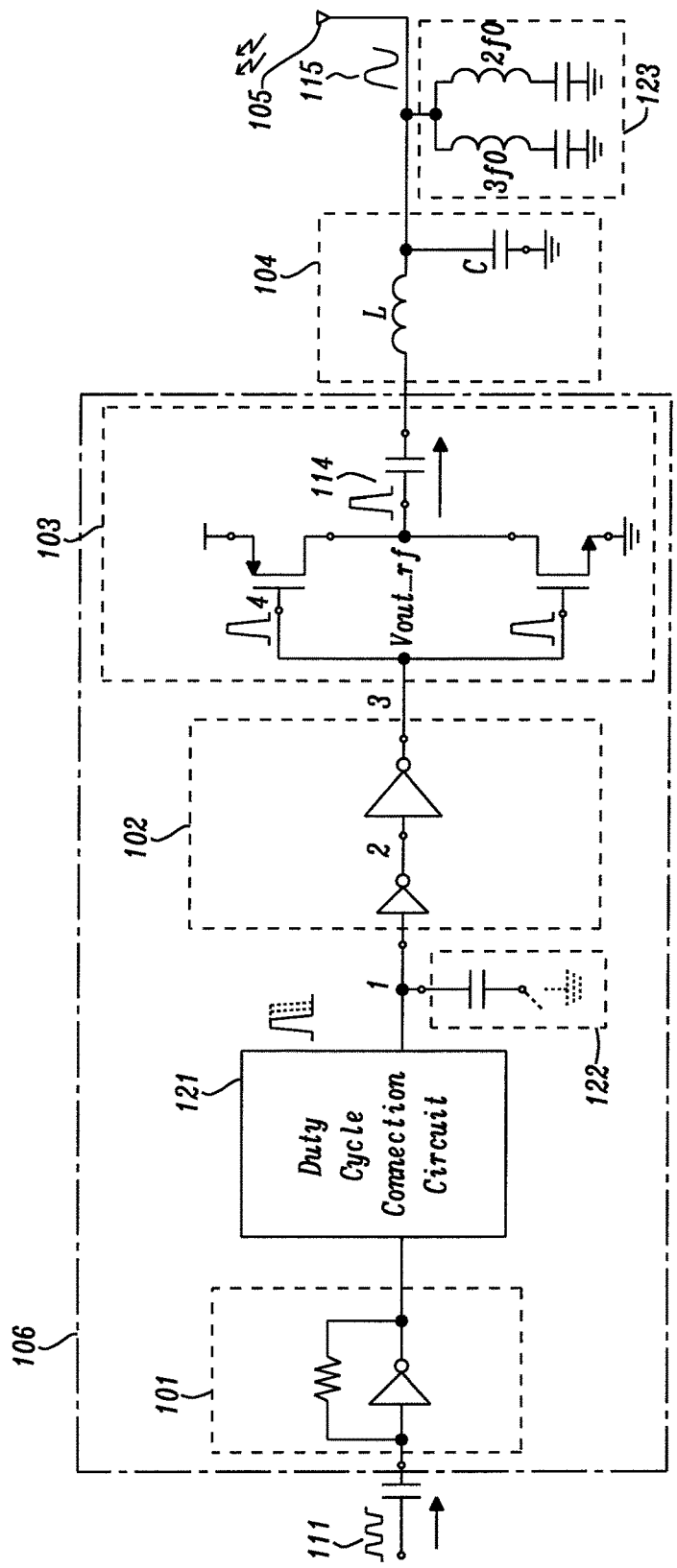
FIG. 1B shows an example digital RF transmitter with means for reducing out-of-band (OOB) energy.

FIG. 1B shows another digital RF transmitter 100. The RF transmitter 100 comprises different circuits 121, 122, 123 for attenuating even harmonics. In particular, a duty cycle correction circuit 121 (at node "1") is shown for maintaining a 50% duty-cycle. This circuit 121 may be used for reducing the level of even harmonics. The circuit 121 may comprise a switched-capacitor RC network. This circuit 121 requires additional components and causes additional power consumption, thereby leading to a reduction of the efficiency of the power amplifier 106.

Alternatively or in addition, a delay circuit 122 may be used on the RF path (e.g. at node 1 or node 2), in order to adjust the duty cycle of the RF clock signal around 50% by adjusting the rise and fall times of the RF signal. The use of such delay circuits 122 may attenuate the RF signal level due to direct capacitive loading on the RF path. Furthermore, the resistivity of the switch (in series with the capacitance) typically reduces the effectiveness of duty-cycle control. Moreover, the attenuation of the RF signal typically requires additional power for driving the push-pull stage 103 of the PA 106 and for boosting the PA output power.

While the above mentioned techniques are directed at reducing even harmonics, no effective active circuit techniques have been described for reducing or mitigating the level of odd harmonics, mainly the $3^{rd}$ harmonic ($3f_0$), which is typically the most dominant one following the desired fundamental ($f_0$) signal.

In order to reduce dominant odd and even harmonics ($3f_0$ and $2f_0$), series passive LC resonators or traps 123 may be used at the output of the transmitter 100 (at the antenna node) as shown in FIG. 1B. Such series resonators 123 exhibit a minimal resistance at the tuned frequencies ($2f_0$ and $3f_0$, for the example shown in FIG. 1B). The inductors within the attenuators 123 typically require a relatively large chip area. Furthermore, the limited quality factor of on-chip inductors typically limits the extent of reduction of the level of the harmonics. In addition, a bank of tuning capacitors, having relatively high losses, may need to be used for each harmonic trap 123, in order to make the harmonic traps 123 work effectively over process and temperature variations. Due to these limitations of passive $2f_0$ and $3f_0$ harmonic attenuators 123, the reduction of the level of the unwanted harmonics typically goes along with the reduction of the output power of the power amplifier 106, thereby reducing the efficiency of the power amplifier 106.

Figure 2:
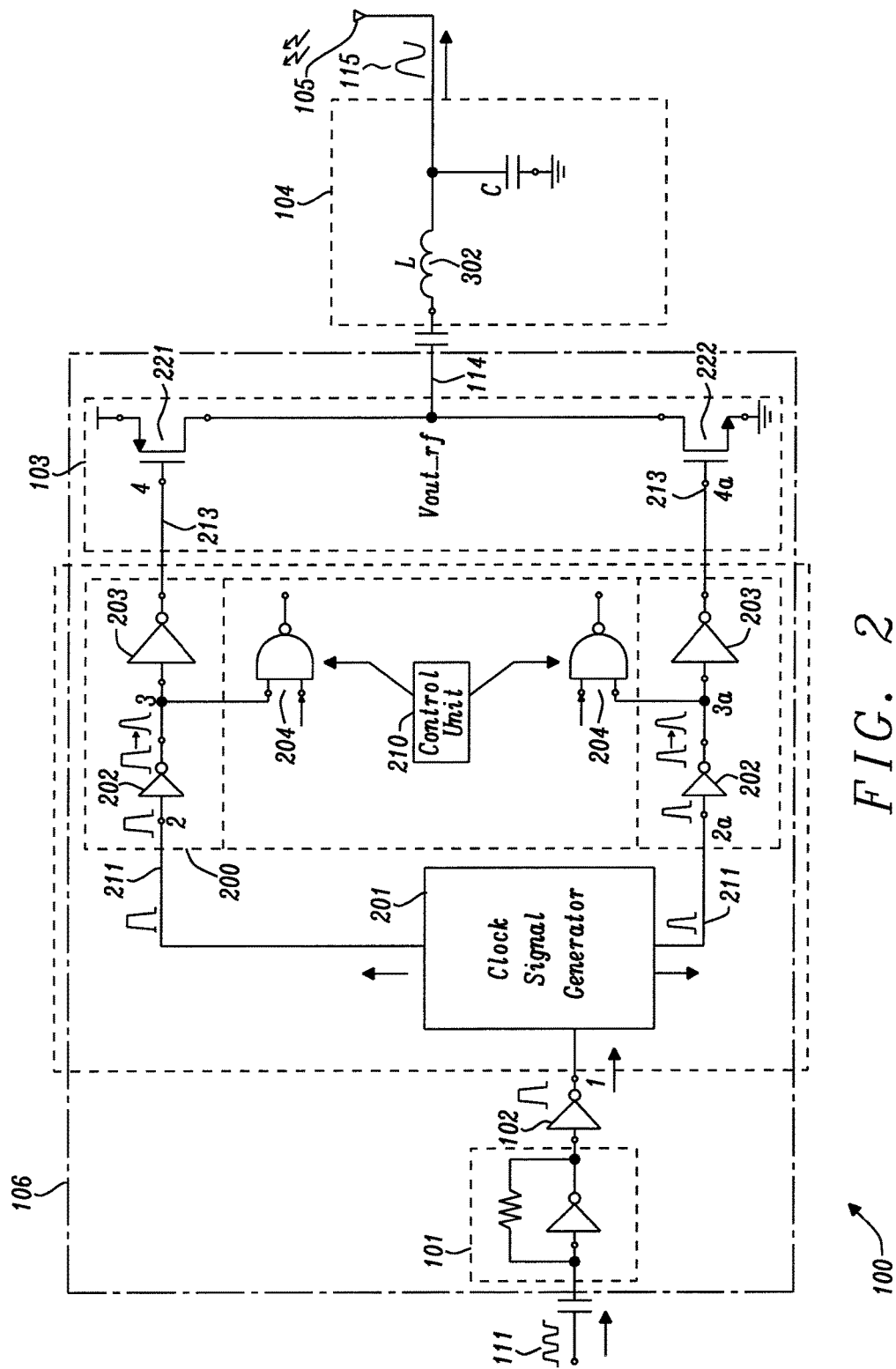
FIG. 2 shows an example digital RF transmitter with pulse reshaping.

FIG. 2 shows a digital RF transmitter 100 with a power amplifier 106 comprising a pulse reshaping unit 200 for shaping the pulses of the drive signals 213 that are used for controlling the high side switch 221 and the low side switch 222 of the output stage 103 of the power amplifier 106. In particular, the drive signals 213 may be applied to the gates of the switches 221, 222, respectively.

The power amplifier 106 comprises a clock signal generator 201 which is configured to generate non-overlapping clock signals 211 (with non-overlapping pulses) for the high side switch 221 and for the low side switch 222, respectively, based on the (pre-processed) input signal 111. It should be noted that the clock signal 211 for the high side switch 221 typically differs from the clock signal 211 for the low side switch 222. The non-overlapping clock signals 211 typically exhibit (rectangular) pulses with sharp rising and falling edges, for switching on or off the respective switches 221, 222 in a digital or binary manner. As outlined above, this digital operation of the switches 221, 222 results in an output signal 114 having significant higher-order harmonic content.

The reshaping unit 200 comprises smoothing circuitry 202, 203, 204 configured to smoothen the edges of the pulses of the clock signals 211. The smoothing circuitry 202, 203, 204 may comprise one or more input capacitances which are charged and/or discharged in dependence of the level of a respective clock signal 211, thereby smoothing the rising and/or falling edges of the pulses of the clock signal 211. By way of example, the reshaping unit 200 may comprise one, two or more inverters 202, 203. Alternatively, or in addition, the reshaping unit 200 may comprise one or more logic gates 204 which exhibit an input capacitance.

As a result, drive signals 213 having reshaped pulses for controlling the high side switch 221 and the low side switch 222, respectively, may be provided. The reshaped pulses of the drive signals 213 cause a relatively smooth opening and closing of the respective switches 221, 222. This leads to an output signal 114 having a sinusoidal shape with reduced higher-order harmonic content.

Hence, an efficient digital transmitter 100 with reduced odd and even harmonic levels is provided, without the use of relatively large and lossy on-chip and/or off-chip LC and RC circuits. This goal is achieved using a non-lossy wave shaping technique within a reshaping unit 200 for adapting or reshaping the clock signals 211 for the switches 221, 222 of the output stage 103. Non-lossy wave shaping significantly reduces the energy of out-of-band transmission, without impacting the desired fundamental signal at the fundamental frequency $f_0$.

The reduced-area RF (2.4-2.5 GHz) transmitter 100 using compact active-circuit harmonic attenuation and control techniques in a voltage-mode Class-D (VMCD) PA 106 is shown in FIG. 2. As outlined above, a reshaping unit 200 for adapting the clock signals 211 is added to the pre-driver stage of the PA 106. A non-overlap clock signal generator 201 is used for generating RF clock signals 211 with non-overlapping clock edges or pulses to drive the complementary switching devices 221, 222 (NMOS and PMOS) of the PA output stage 106 for increased efficiency. Active-circuit techniques at the internal nodes 3 and 3a of the inverter buffer chains may be employed for $2^{nd}$ and/or $3^{rd}$ harmonic attenuation and control. First, a relatively high-ratio (1×: 8× up to 1×:16×) inverter chain comprising a first inverter 202 (e.g. with a size ratio 1×) and a second inverter 203 (e.g. with a size from 4× (1:1), 8× (1:2), 12× (1:3) to 16× (1:4)) may be used. Secondly, a number n of unloaded logic gate cells 204 (e.g. nand2 or nor2 gates) may be tapped at the internal nodes (e.g. node "3" and "3a") of the inverter buffer chain. Both circuit techniques change the shape of the pulses of the clock signals 211 from rectangular (with even symmetry and no even harmonics) to triangular or half-sinusoid (with odd symmetry and no odd harmonics). The shape of the pulses of the drive signals 213 depends on the ratio of the inverters 202, 203 in the buffer chain and/or on the number n of active logic gates 204.

The Fourier analysis shows that a half-sinusoid drive signal 213 only contains the fundamental frequency ($f_0$) and relatively weak odd and even harmonics ($2f_0$, $3f_0$, $4f_0$, $5f_0$, ... ), whereas a rectangular control signal 213 contains the fundamental frequency ($f_0$) and relatively strong odd harmonics ($3f_0$ being the dominant one).

For a relatively large suppression, attenuation and control of harmonics (notably $2^{nd}$ and $3^{rd}$ harmonics) in a switch-mode power amplifier 106, two active-circuit techniques may be used as shown in FIG. 2. With a fixed inverter ratio between the first inverter 202 and the second inverter 203 (1× to 8×, 1× to 12× or 1× to 16×) of the buffer chain, a balanced level of $2^{nd}$ and $3^{rd}$ harmonics may be established by shaping the pulses of the clock signals 211 at node "3" (and "3a") to have a form between rectangular and half sinusoidal. Relatively high inverter ratios of the second inverter 203 to the first inverter 203 (e.g. 8 or higher, or 12 or higher, or 16 or higher) may be used to reshape a pulse of the clock signal 211 at node "3" from rectangular to near half sinusoidal. The inverter ratio may be increased until the signal amplitude starts to degrade.

In addition, the programmability of the number n of logic gates 204 allows for changing the shape of the pulses of the clock signal 211 from fully rectangular to fully half-sinusoidal. Programmability of the logic gates 204 further extends the range of rectangular to half-sinusoid pulse-shaping and allows for compensation of deviations over process and temperatures. It should be noted that unlike direct loading capacitive delay elements 122 (as shown in FIG. 1B), the unloaded logic gate delay elements 204 do not reduce the level of the RF clock signals 211 (at node "3" and "3a"). Furthermore, the proposed scheme does not make use of area-inefficient (large area) passive LC resonators.

The theoretical principal of the scheme outlined in FIG. 2 is pulse-shaping instead of delaying the phases of RF signals or clocks (as shown in FIG. 1B) to attenuate the $2^{nd}$ and $3^{rd}$ harmonic levels at the PA output signal 114. Moreover, systematic balance controlling of harmonic levels may be provided.

Figure 3:
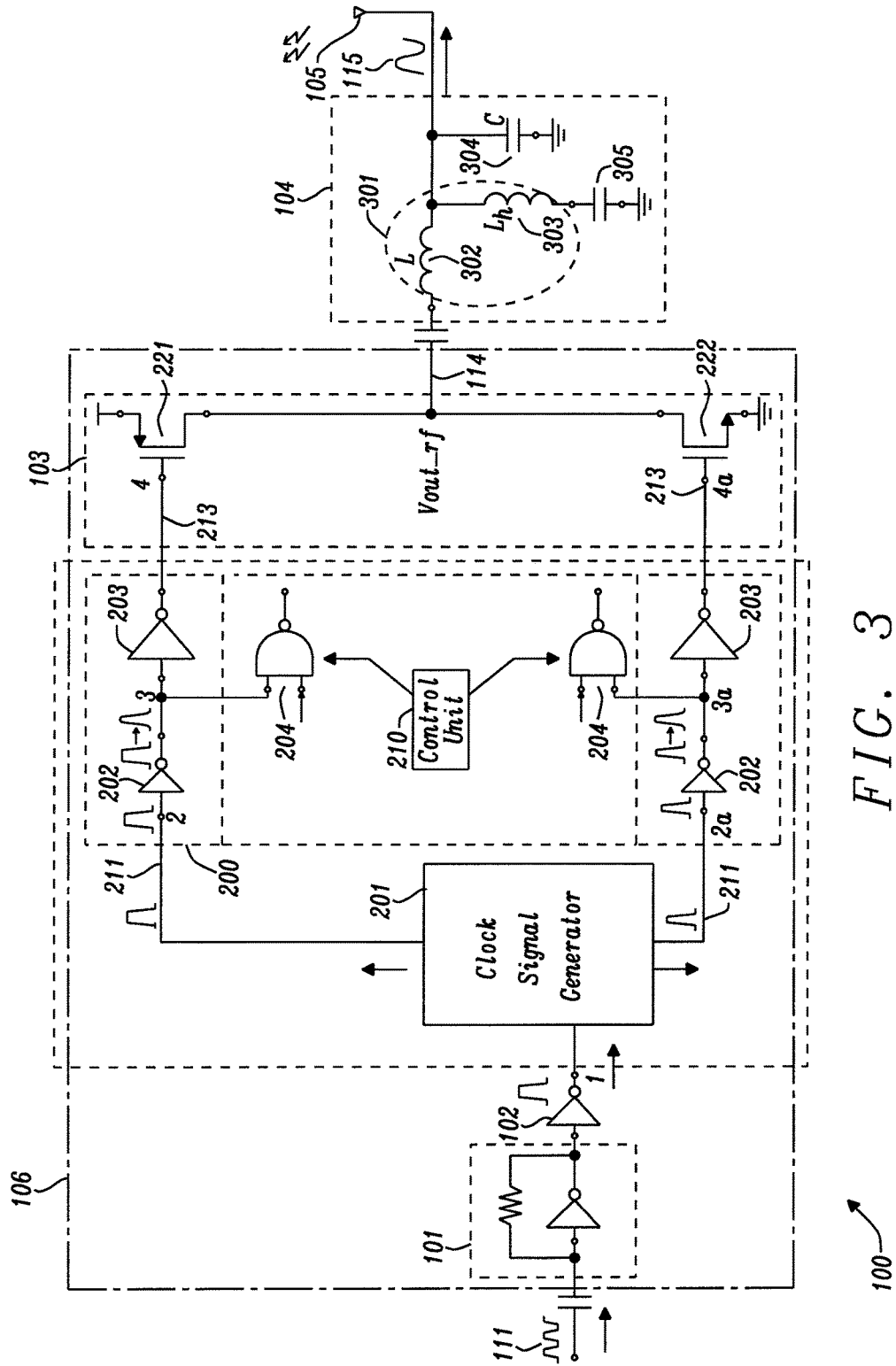
FIG. 3 shows the RF transmitter of FIG. 2 with a matching network comprising a composite coil.

In order to further enhance the harmonic attenuation, a compact passive composite RF coil 301 may be added at the output of the RF transmitter 100 as shown in FIG. 3. Without requiring additional chip or die area, a relatively small auxiliary coil 303 $L_h$ may be placed inside the relatively large main coil 302 L of the LC matching network 104. The relatively small coil inductor ($L_h$) in series with a capacitor 305 forms the $3^{rd}$ order harmonic series attenuator. It can be shown that using the circuitry of FIG. 3, the level of the $3^{rd}$ order harmonic may be reduced below −60.0 dBm for 6.3 dBm total transmitted power. A reduced chip area digital RF BLE transmitter 100 for low-cost BLE radio transceivers may be provided based on the circuitry of FIG. 3.

Hence, an RF transmitter 100 comprising a relatively high size-ratio (1×-to-8×/12×/16×) cascaded inverter chain within the RF signal paths of an all-digital PA 106 is described. The RF transmitter 100 may comprise floating-load logic-gates 204 tapped at the internal nodes of the cascaded inverter chains. In particular, the RF transmitter 100 may comprise an array of programmable logic gate cells 204. The relatively high ratio of the size of the inverters 202, 203 allows for reshaping the RF clock signals 211 from rectangular (even symmetry with no or attenuated even harmonies) to triangular or half sinusoid (odd symmetry with no or attenuated odd harmonics). Unloaded logic-gates 204 tapped at the internal nodes of the cascaded inverter chains may attenuate harmonic level without causing any significant loss of the RF signals. An array of programmable logic gate cells 204 may be used to control harmonic level coarsely or finely for different operating conditions.

Hence, low-loss logic gates 204 may be used to shape the pulses of a clock signal 211 from rectangular (even symmetry) to half-sinusoid (odd symmetry) and vice versa, in order to attenuate and control the level of both $2^{nd}$ and $3^{rd}$ harmonic. A balance harmonic control (between $2^{nd}$ and $3^{rd}$ harmonic) may be used to obtain improved PA efficiency, while occupying a relatively small die-area, thereby enabling reduced die-area all-digital RF transmitters 100.

In the present document, a digital power amplifier 106 configured to provide an amplified output signal 114 at an output port based on an input signal 111 is described. The input signal 111 may comprise a sequence of pulses. The sequence of pulses of the input signal 111 may represent an analog RF signal which is to be amplified by the digital power amplifier 106 and/or which is to be transmitted by an RF (radio frequency) transmitter 100 which comprises the digital power amplifier 106.

The power amplifier 106 comprises an output stage 103, wherein the output stage 103 comprises a serial arrangement of a high side switch 221 and a low side switch 222. The high side switch 221 may comprise a NMOS (i.e. an n-type metal oxide semiconductor) transistor and the low side switch 222 may comprise a PMOS (i.e. a p-type metal oxide semiconductor) transistor, or vice versa. The output port for providing the output signal 114 may be coupled to the midpoint between the high side switch 221 and the low side switch 222.

Furthermore, the power amplifier 106 comprises a drive unit 201, 200 which is configured to generate a high side drive signal 213 comprising a sequence of pulses for controlling the high side switch 221, based on the input signal 111. Furthermore, the drive unit 201, 200 is configured to generate a low side drive signal 213 comprising a sequence of pulses for controlling the low side switch 222, based on the input signal 111.

The high side drive signal 213 and the low side drive signal 213 may be generated such that the pulses of the high side drive signal 213 are non-overlapping with regards to the pulses of the low side drive signal 213. In particular, the drive signals 213 may be generated such that the high side switch 221 and the low side switch 222 are open in a mutually exclusive manner and/or in an alternating manner.

Furthermore, the high side drive signal 213 and the low side drive signal 213 may be generated such that the sequence of pulses of the high side drive signal 213 and the sequence of pulses of the low side drive signal 213 have a reduced fraction of energy from higher order harmonics compared to a (corresponding) sequence of rectangular shaped pulses. A drive signal 213 may exhibit a total energy, wherein a fraction of the total energy may lie within the fundamental frequency $f_0$ of the drive signal 213 and wherein the remaining fraction of the total energy may lie within the higher order frequencies, i.e. at one or more frequencies corresponding to the fundamental frequency $f_0$ multiplied by a positive odd or even integer K greater than one, with K=2, 3 and/or higher. The high side drive signal 213 and the low side drive signal 213 may be generated such that the latter fraction of the total energy is lower for the sequence of pulses of the high side drive signal 213 and/or for the sequence of pulses of the low side drive signal 213 compared to a (corresponding) sequence of rectangular shaped pulses (having the same number of pulses as the drive signals 213).

In particular, the high side drive signal 213 and the low side drive signal 213 may be generated such that the fraction of energy from higher order harmonics is reduced by 20% or more, 30% or more, or 50% or more compared to the fraction of energy from higher order harmonics in a (corresponding) sequence of rectangular shaped pulses.

By reducing the fraction of energy from higher order harmonics within the drive signals 213 of the switches 221, 222 of the output stage 103 of the power amplifier 106, a power efficient power amplifier 106 with reduced OOB energy may be provided.

The drive unit 201, 200 may comprise a clock signal generator 201 which is configured to generate a high side clock signal 211 comprising a sequence of rectangular shaped pulses for controlling the high side switch 221 and a low side clock signal 211 comprising a sequence of rectangular shaped pulses for controlling the low side switch 222, respectively, based on the input signal 111, such that the pulses of the high side clock signal 211 are non-overlapping with regards to the pulses of the low side clock signal 211.

Furthermore, the drive unit 201, 200 may comprise a reshaping unit 200 which comprises a high side reshaping path for reshaping (each one of) the pulses of the high side clock signal 211 to generate the high side drive signal 213 with a sequence of reshaped pulses for controlling the high side switch 221. Furthermore, the reshaping unit 200 comprises a low side reshaping path for reshaping (each one of) the pulses of the low side drive signal 211 to generate the low side drive signal 213 with a sequence of reshaped pulses for controlling the low side switch 221. The reshaping may be performed such that the sequences of reshaped pulses have a reduced energy of higher order harmonics compared to the sequences of rectangular shaped pulses, respectively (notably reduced by 20% or more, 30% or more, or 50% or more). By reshaping rectangular pulses (notably into triangular or half-sinusoidal pulses), the drive signals 213 may be generated in a reliable and efficient manner.

The reshaping unit 200 may comprise on the high side reshaping path and/or on the low side reshaping path, respectively, one or more inverters 202, 203, notably one or more CMOS inverters, which each are configured to perform a logical negation of pulses. The one or more inverters 202, 203 may exhibit an overall width to length aspect ratio of 2 or higher, 3 or higher, 4 or higher, 8 or higher, 12 or higher, or 16 or higher.

In particular, the reshaping unit 200 may comprise on the high side reshaping path and/or on the low side reshaping path, respectively, an inverter chain with a first inverter 202 followed by a second inverter 203. The width to length aspect ratio of the second inverter 203 may be higher than the width to length aspect ratio of the first inverter 202, notably by a factor 2 or higher, 3 or higher, 4 or higher, 8 or higher, 12 or higher, or 16 or higher.

By making use of one or more inverters, notably of one or more inverters having relatively high size ratios, the pulses of the clock signals 211 may be reshaped (to a triangular or half-sinusoidal form) in a power efficient manner.

Alternatively, or in addition, the reshaping unit 200 may comprise on the high side reshaping path and/or on the low side reshaping path, respectively, an array of one or more logic gates 204. The one or more logic gates 204 may each comprise a NAND gate and/or NOR gate, notably in CMOS technology.

Furthermore, the reshaping unit 200 may comprise on the high side reshaping path and/or on the low side reshaping path, respectively, a signal path for transmitting the pulses. The inverter chain with the one or more inverters may be arranged sequentially on the signal path.

Each logic gate 204 from the array of one or more logic gates 204 may comprise at least one input and/or at least one output. The inputs of the one or more logic gates 204 may be coupled to the signal path. On the other hand, the output of the one or more logic gates 204 may not be coupled to the signal path. In particular, the output of the one or more logic gates 204 may be floating and/or unloaded.

By making use of an array of one or more logic gates 204 (each one having an input capacitance), the pulses on a signal path may be reshaped in a power efficient manner.

In particular, the array of logic gates 204 may comprise a plurality of logic gates 204, wherein the inputs of the plurality of logic gates 204 may each be coupled to the signal path. Each one of the logic gates 204 may be configured to be activate or deactivated, wherein a logic gate 204 may be such that an activated logic gate 204 impacts the reshaping of the pulses, wherein a deactivated logic gate 204 does not impact the reshaping of the pulses. Hence, the activation and/or deactivation of logic gates 204 may be used to adapt the reshaping of pulses (e.g. in order to compensate process and/or temperature deviations).

The reshaping unit 200 may comprise a control unit 210 which is configured to activate and/or deactivate each one of the plurality of logic gates 204 in a selective manner. In particular, the control unit 210 may be configured to determine an out-of-band indication of the fraction of energy from higher order harmonics in the reshaped pulses. In addition, the control unit 210 may be configured to determine a number of logic gates 204 to be activated, based on the out-of-band indication. Furthermore, the control unit 210 may be configured to selectively activate the determined number of logic gates 204 from the plurality of logic gates 204, with the one or more remaining logic gates 204 from the plurality of logic gates 204 being deactivated. By doing this, the OOB energy may be further reduced.

As indicated above, the reshaping unit 200 may comprise on the high side reshaping path and/or on the low side reshaping path, respectively, an inverter chain with a first inverter 202 being followed by a second inverter 203, wherein the first inverter 202 and the second inverter 203 are arranged sequentially on the signal path. The input of the one or more logic gates 204 may be coupled to a midpoint on the signal path between the first inverter 202 and the second inverter 203. By doing this, reshaping may be performed in a particularly efficient and reliable manner.

The digital power amplifier 106 may comprise a matching network 104 which is configured to filter the output signal 114 to provide a filtered output signal 115, wherein the filtered output signal 115 may be provided to an antenna 105 for transmission. The matching network 104 may comprise a main coil 302 and a main capacitance 304, which jointly form an LC matching network.

In particular, the matching network 104 may comprise a composite coil 301 with the main coil 302 at least partially enclosing an auxiliary coil 303. The auxiliary coil 303 may be coupled to the output of the main coil 302. In addition, the matching network 104 may comprise an auxiliary capacitance 305 being arranged in series with the auxiliary coil 303 and forming a higher order harmonic, notably a $3^{rd}$ order harmonic, attenuator. By providing a matching network 104, the OOB energy of the filtered output signal 115 may be reduced further.

According to a further aspect, a RF transmitter 100 is described which comprises the digital power amplifier 106 described herein. Furthermore, the RF transmitter 100 comprises an antenna 105 which is configured to transmit a transmission signal 115 (e.g. the filtered output signal 115) derived from the output signal 114 of the digital power amplifier 106 (e.g. by using a matching network 104). In particular, the RF transmitter 100 may be configured to transmit a Bluetooth RF signal and/or to transmit a transmission signal 115 at a fundamental frequency $f_0$ in the range between 2.4 GHz and 2.5 GHz.

FIG. 4 shows a flow chart of an example method 400 for providing an amplified output signal 114 at an output port based on an input signal 111. The method 400 comprises generating 401 a high side drive signal 213 comprising a sequence of pulses for controlling a high side switch 221, and a low side drive signal 213 comprising a sequence of pulses for controlling a low side switch 222, respectively, based on the input signal 111.

The drive signals 213 may be generated 402 such that the pulses of the high side drive signal 213 are non-overlapping with regards to the pulses of the low side drive signal 213. Furthermore, the drive signals 213 may be generated 403 such that the sequence of pulses of the high side drive signal 213 and of the low side drive signal 213 have a reduced fraction of energy from higher order harmonics compared to a (corresponding) sequence of rectangular shaped pulses. In particular, the drive signals 213 may be generated 401 such that the sequence of pulses of the high side drive signal 213 and of the low side drive signal 213 have a fraction of energy from higher order harmonics, which is reduced by 20% or more, 30% or more, or 50% or more compared to a fraction of energy from higher order harmonics in a (corresponding) sequence of rectangular shaped pulses (having the same number of pulses as the respective drive signals 213).

Furthermore, the method 400 comprises generating 404 the output signal 114 using a serial arrangement of the high side switch 221 being controlled by the high side drive signal 213 and the low side switch 222 being controlled by the low side drive signal 213.

It should be noted that the description and drawings merely illustrate the principles of the proposed methods and systems. Those skilled in the art will be able to implement various arrangements that, although not explicitly described or shown herein, embody the principles of the invention and are included within its spirit and scope.

Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A digital power amplifier configured to provide an amplified output signal at an output port based on an input signal; wherein the input signal comprises a sequence of pulses; wherein the power amplifier comprises an output stage comprising a serial arrangement of a high side switch and a low side switch; wherein the output port is coupled to a midpoint between the high side switch and the low side switch; and a drive unit configured to generate a high side drive signal comprising a sequence of pulses for controlling the high side switch and a low side drive signal comprising a sequence of pulses for controlling the low side switch, respectively, based on the input signal, such that the sequence of pulses of the high side drive signal are non-overlapping with regards to the sequence of pulses of the low side drive signal; and the sequence of pulses of the high side drive signal and the sequence of pulses of the low side drive signal have a reduced fraction of energy from higher order harmonics compared to a sequence of rectangular shaped pulses, notably a fraction of energy from higher order harmonics which is reduced by 20% or more compared to a fraction of energy from higher order harmonics in a sequence of rectangular shaped pulses.

2. The digital power amplifier of claim 1, wherein the drive unit comprises a clock signal generator configured to generate a high side clock signal comprising a sequence of rectangular shaped pulses for controlling the high side switch and a low side clock signal comprising a sequence of rectangular shaped pulses for controlling the low side switch, respectively, based on the input signal, such that the sequence of rectangular shaped pulses of the high side clock signal are non-overlapping with regards to the sequence of rectangular shaped pulses of the low side clock signal; and a reshaping unit comprising
- a high side reshaping path for reshaping the sequence of rectangular shaped pulses of the high side clock signal to generate the high side drive signal with a sequence of reshaped pulses for controlling the high side switch, and
- a low side reshaping path for reshaping the sequence of rectangular shaped pulses of the low side clock signal to generate the low side drive signal with a sequence of reshaped pulses for controlling the low side switch;

wherein the reshaping is performed such that the sequences of reshaped pulses have a reduced energy of higher order harmonics compared to the sequences of rectangular shaped pulses, respectively.

3. The digital power amplifier of claim 2, wherein the reshaping unit comprises on the high side reshaping path and/or on the low side reshaping path, respectively, one or more inverters, comprising one or more CMOS inverters, configured to perform a logical negation of pulses.

4. The digital power amplifier of claim 3, wherein the one or more inverters exhibit an overall width to length aspect ratio of 3 or higher.

5. The digital power amplifier of claim 3, wherein
the reshaping unit comprises on the high side reshaping path and/or on the low side reshaping path, respectively, an inverter chain with a first inverter followed by a second inverter; and
a width to length aspect ratio of the second inverter is higher than a width to length aspect ratio of the first inverter, by a factor 8 or higher.

6. The digital power amplifier of claim 2, wherein
the reshaping unit comprises on the high side reshaping path and/or on the low side reshaping path, respectively, an array of one or more logic gates;
the reshaping unit comprises on the high side reshaping path and/or on the low side reshaping path, respectively, a signal path for transmitting the sequence of reshaped pulses;
a logic gate from the array of one or more logic gates comprises an input and an output;
the input of the logic gate is coupled to the signal path; and
the output of the logic gate is not coupled to the signal path.

7. The digital power amplifier of claim 6, wherein the output of the logic gate is floating and/or unloaded.

8. The digital power amplifier of claim 6, wherein
the array of logic gates comprises a plurality of logic gates;
the inputs of the plurality of logic gates are each coupled to the signal path; and
the reshaping unit comprises a control unit configured to activate and/or deactivate each one of the plurality of logic gates in a selective manner.

9. The digital power amplifier of claim 8, wherein the control unit is configured to determine an out-of-band indication of the fraction of energy from higher order harmonics in the sequence of reshaped pulses;
determine a number of logic gates to be activated, based on the out-of-band indication; and
selectively activate the determined number of logic gates from the plurality of logic gates, with the remaining logic gates from the plurality of logic gates being deactivated.

10. The digital power amplifier of claim 6, wherein the logic gate comprises a NAND gate and/or NOR gate, notably in CMOS technology.

11. The digital power amplifier of claim 6, wherein
the reshaping unit comprises on the high side reshaping path and/or on the low side reshaping path, respectively, an inverter chain with a first inverter followed by a second inverter;
the first inverter and the second inverter are arranged sequentially on the signal path; and
the input of the logic gate is coupled to a midpoint between the first inverter and the second inverter.

12. The digital power amplifier of claim 1, wherein the digital power amplifier comprises a matching network configured to filter the amplified output signal to provide a filtered output signal, for transmission using an antenna.

13. The digital power amplifier of claim 12, wherein
the matching network comprises a composite coil with a main coil which at least partially encloses an auxiliary coil;
the matching network comprises a main capacitance forming an LC matching network with the main coil;
the matching network comprises an auxiliary capacitance being arranged in series with the auxiliary coil and forming a higher order harmonic, comprising a $3^{rd}$ order harmonic, attenuator; and
the auxiliary coil is coupled to an output of the main coil.

14. The digital power amplifier of claim 1, wherein the high side switch comprises a NMOS transistor and the low side switch comprises a PMOS transistor, or the high side switch comprises a PMOS transistor and the low side switch comprises an NMOS transistor.

15. The digital power amplifier of claim 1, wherein
the input signal, the amplified output signal and/or the drive signals exhibit a fundamental frequency $f_0$;
the higher order harmonics exhibit one or more frequencies corresponding to the fundamental frequency $f_0$ multiplied by a positive odd or even integer K greater than one; and
K=2 or higher.

16. The digital power amplifier of claim 1, wherein the sequence of pulses of the input signal represents an analog RF signal which is to be amplified by the digital power amplifier.

17. A RF transmitter comprising
the digital power amplifier of claim 1; and
an antenna configured to transmit a transmission signal derived from the amplified output signal of the digital power amplifier.

18. The RF transmitter of claim 17, wherein the RF transmitter is configured to
transmit a Bluetooth RF signal; and/or
transmit a transmission signal at a fundamental frequency in a range between 2.4 GHz and 2.5 GHz.

19. A method for providing an amplified output signal at an output port based on an input signal; wherein the input signal comprises a sequence of pulses; wherein the method comprises generating a high side drive signal comprising a sequence of pulses for controlling a high side switch and a low side drive signal comprising a sequence of pulses for controlling a low side switch, respectively, based on the input signal, such that
    the sequence of pulses of the high side drive signal are non-overlapping with regards to the sequence of pulses of the low side drive signal; and
    the sequence of pulses of the high side drive signal and of the low side drive signal have a reduced fraction of energy from higher order harmonics compared to a sequence of rectangular shaped pulses, notably a fraction of energy from higher order harmonics which is reduced by 20% or more compared to a fraction of energy from higher order harmonics in a sequence of rectangular shaped pulses; and generating the amplified output signal using a serial arrangement of the high side switch being controlled by the high side drive signal and the low side switch being controlled by the low side drive signal; wherein the amplified output signal is provided at a midpoint between the high side switch and the low side switch.

\* \* \* \* \*